United States Patent
Motwani et al.

(10) Patent No.: US 10,944,428 B2
(45) Date of Patent: Mar. 9, 2021

(54) DEVICE, SYSTEM AND METHOD FOR DETERMINING BIT RELIABILITY INFORMATION

(71) Applicant: Intel Corporation, Santa Clara, CA (US)

(72) Inventors: Ravi Motwani, Fremont, CA (US); Poovaiah Palangappa, San Jose, CA (US); Santhosh Vanaparthy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 16/398,003

(22) Filed: Apr. 29, 2019

(65) Prior Publication Data
US 2019/0260394 A1 Aug. 22, 2019

(51) Int. Cl.
*H03M 13/00* (2006.01)
*H03M 13/15* (2006.01)
(Continued)

(52) U.S. Cl.
CPC .......... *H03M 13/15* (2013.01); *G06F 11/076* (2013.01); *G06F 11/1004* (2013.01); *G06F 11/1012* (2013.01); *G06F 11/1048* (2013.01); *H03M 13/3761* (2013.01); *H03M 13/3927* (2013.01); *H03M 13/658* (2013.01)

(58) Field of Classification Search
None
See application file for complete search history.

(56) References Cited

U.S. PATENT DOCUMENTS 6,654,926 B1 * 11/2003 Raphaeli .......... H03M 13/2906
714/780
8,051,363 B1 * 11/2011 Liu .................. H03M 13/3707
714/780
(Continued)

OTHER PUBLICATIONS

W. Gao and S. Simmons, "A study on the VLSI implementation of ECC for embedded DRAM," CCECE 2003—Canadian Conference on Electrical and Computer Engineering. Toward a Caring and Humane Technology (Cat. No. 03CH37436), Montreal, Quebec, Canada, 2003, pp. 203-206 vol. 1, doi: 10.1109/CCECE.2003.1226378. (Year: 2003).*

*Primary Examiner* — Daniel F. McMahon
(74) *Attorney, Agent, or Firm* — Green, Howard & Mughal LLP

(57) ABSTRACT

Techniques and mechanisms for determining information which is to be used for performing bit error correction. In an embodiment, bit reliability information is calculated based on a first likelihood function, and also on data signals which each indicate a respective bit of a codeword. Values of the bit reliability information each indicate, for a respective bit of the codeword, a confidence that the bit is at a particular logic state. A syndrome vector is calculated based on the bit reliability information, and one of the first likelihood function or a second likelihood function is selected based on one or more bit errors which are indicated by the syndrome vector. The selected one of the first likelihood function or the second likelihood function is used to correct bit errors of the codeword. In another embodiment, the first likelihood function is a default likelihood function to be used for initial syndrome vector calculations.

17 Claims, 9 Drawing Sheets

(51) Int. Cl.
*H03M 13/37* (2006.01)
*H03M 13/39* (2006.01)
*G06F 11/10* (2006.01)
*G06F 11/07* (2006.01)

(56) References Cited

U.S. PATENT DOCUMENTS

| | | | |
|---|---|---|---|
| 2008/0008272 A1* | 1/2008 | Yang | H04L 25/03203 |
| | | | 375/341 |
| 2011/0087933 A1* | 4/2011 | Varnica | H03M 13/1128 |
| | | | 714/704 |
| 2011/0107188 A1* | 5/2011 | Dror | H03M 13/152 |
| | | | 714/773 |
| 2013/0111289 A1* | 5/2013 | Zhang | H03M 13/1108 |
| | | | 714/752 |
| 2018/0159560 A1* | 6/2018 | Sharon | G06F 3/067 |
| 2018/0262215 A1* | 9/2018 | Sharon | H03M 13/458 |
| 2020/0004629 A1* | 1/2020 | Zamir | G06F 3/0619 |

* cited by examiner

DEVICE, SYSTEM AND METHOD FOR DETERMINING BIT RELIABILITY INFORMATION

BACKGROUND

1. Technical Field

This disclosure generally relates to data communications and more particularly, but not exclusively, to determining bit reliability information for use in data error correction.

2. Background Art

A communication channel, whether it is a fiber optic channel, a co-axial channel, a wired channel, a wireless channel, or a bus connecting locations in a system over which large amounts of data are transferred, can add noise and error to data being transmitted over the channel. Moreover, open lines, shorts and other defects are prevalent in various memory architectures. Typically, these defects are present at the time of manufacture, or are generated through the operating life of a memory due to regular wear and tear. Channel noise and memory defects are two possible factors which contribute to a raw bit error rate (RBER) of communicated data. The term "RBER" here generally refers to the rate of errors in data which is read, or otherwise received, from a data source.

To mitigate the risk of such errors Low-Density Parity-Check techniques variously communicate an n-bit codeword which comprises k data bits, and r error correction bits (e.g., parity check bits), where n is an integer equal to the sum of integers k and r. A parity check matrix, H, represents a set of parity check equations that define the codeword according to the relation $HC^T=0$, where C is an n-dimensional vector of the codeword bits. If this relation is not satisfied at receiver device, then the received codeword is not valid and must either be corrected or retransmitted.

A variety of schemes for decoding a communicated codeword exist. As successive generations of interconnect technologies and memory technologies continue to support better communication frequencies and power efficiency (e.g., at lower voltages), there is expected to be a growing demand placed on improvements to error detection and correction schemes.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
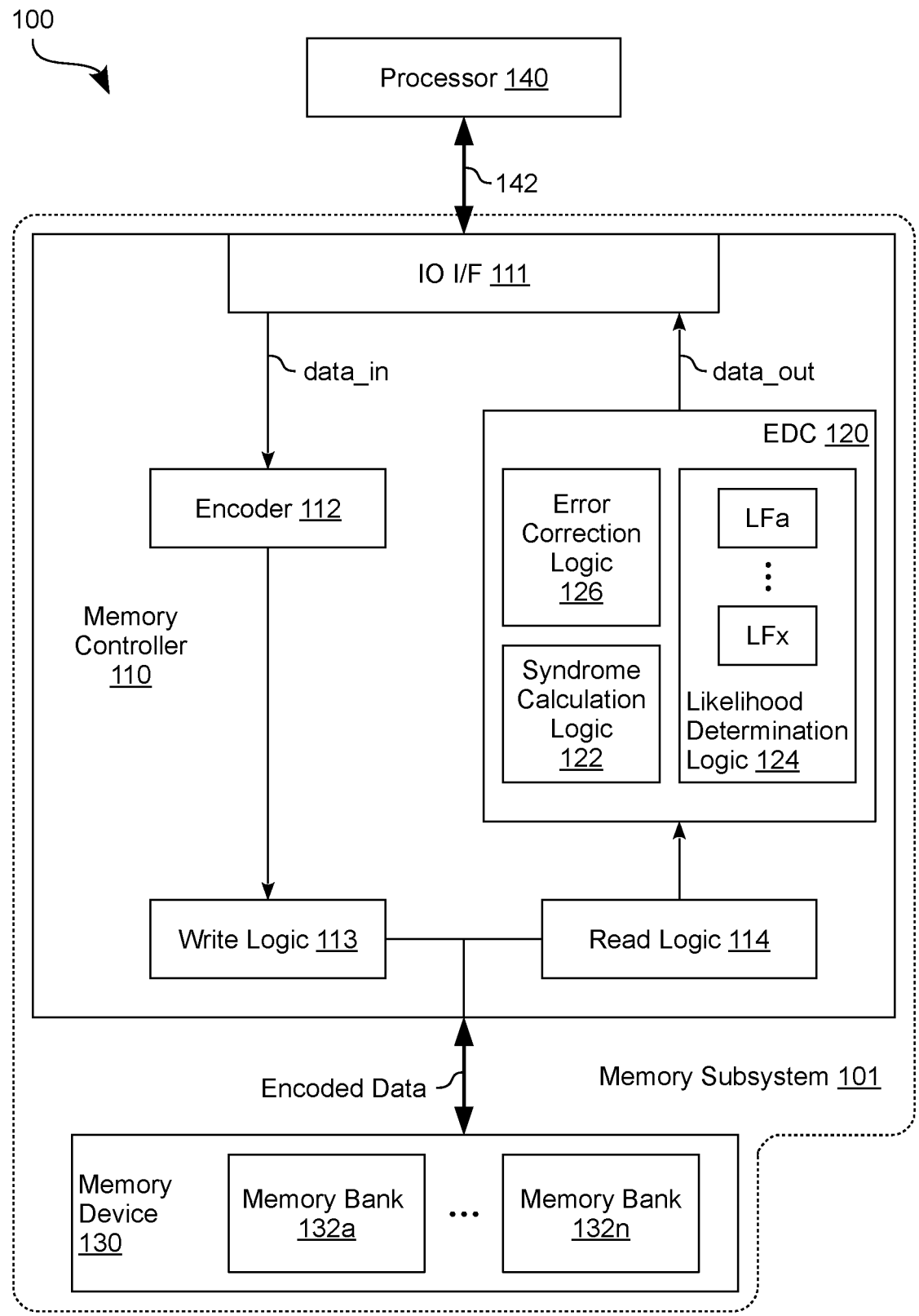
FIG. 1 shows a functional block diagram illustrating elements of a system to perform error correction according to an embodiment.

Embodiments described herein variously provide techniques and mechanisms for determining information which is to be used for performing error correction. In an embodiment, such information is generated based on a function (referred to herein as a "likelihood function") which corresponds various levels of a signal characteristic each with a respective value of a metric. Such a metric (referred to herein as a "likelihood metric") indicates, for example, a level of confidence that a given data bit is at a particular one of a logic low state, or a logic high state.

In various embodiments, one likelihood function is selected over another likelihood function for use in error correction of a given codeword which, for example, is encoded according to a low density parity check (LDPC) scheme. Such selection is performed based on the calculation of a syndrome vector, where said calculation uses one of the likelihood functions, and information which indicates bit values of the codeword. For example, the selection of a particular likelihood function is based on a number of bit errors which are indicated by the calculated syndrome—e.g., where the likelihood functions are identified each as corresponding to a different respective range of possible values for the number of bit errors. By enabling the selective use of one likelihood function over another likelihood function, some embodiments variously facilitate improved error correction functionality which accounts for the indicated data errors of a given codeword.

As used herein, "soft reliability value" refers to the value of a likelihood metric for a given data bit (e.g., a given bit of a codeword). For example, a soft reliability value for a corresponding bit is determined, according to a particular likelihood function, based on a data signal characteristic (e.g., a voltage level) which indicates a logic state of that bit. As used herein with respect to error correction for a given codeword, the term "bit reliability information" refers to a set of soft reliability values each for a respective bit of said codeword.

A soft reliability value is to be distinguished from—e.g., is more granular than—a "hard" reliability value which, for example, identifies a particular bit only as being a specific one of a logic low ("0") state or a logic high ("1") state. By contrast, a soft reliability value quantifies some intermediate level of confidence, or lack of said confidence, that the bit in question is at a particular logic state (or alternatively, is not at that particular logic state).

In some embodiments, for example, a soft reliability value is one in a range of possible values—e.g., a fractional value in a range of −1 to +1, where the value −1 represents total confidence that the bit in question is at a logic low state, and the value +1 represents total confidence that the bit in question is at a logic high state. In another embodiment, a soft reliability value is a 4-bit value (for example) representing one of 8 different levels of confidence that a bit is more likely to be at a logic low state, or one of 8 different levels of confidence that a bit is more likely to be at a logic high state. In an embodiment, a soft reliability value includes or is otherwise based on a probability value—e.g., wherein the soft reliability value includes or is otherwise based on a log likelihood ratio (LLR) value.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to perform data error correction.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

FIG. 1 illustrates a system 100 to perform error correction which, according to an embodiment, is based on a selection of one likelihood function over another likelihood function. Such selection is made based on the calculation and evaluation of a syndrome vector for a codeword which is to be the subject of said error correction.

As shown in FIG. 1, system 100 includes a memory sub-system 101 and a processor 140 coupled thereto—e.g., wherein memory sub-system 101 comprises a memory device 130 and a memory controller 110 which is coupled to provide processor 140 with access to memory device 130. In some embodiments, memory sub-system 101 is, or otherwise includes, a solid state drive (SSD), for example. In other embodiments, other types of storage units may be used. Processor 140 is one example of circuitry—e.g., including any of various microprocessors (such as those designed by Intel Corporation of Santa Clara, Calif.), digital signal processors (DSPs), field-programmable gate arrays (FPGAs), application specific integrated circuits (ASICs), radio-frequency integrated circuits (RFICs), or the like—which is to receive data for which error correction is performed.

So as not to obscure the embodiments, a simplified example of one memory sub-system 101 is shown. A person skilled in the art would appreciate that there are other logic and circuits needed for complete operation of system 100. For example, queues, input-output buffers, multiplexers, sense amplifiers, etc., are not shown.

In some embodiments, memory sub-system 101 includes input/output interface IO I/F 111, memory controller 110, and a plurality of memory banks (or other such memory resources) logically combined as memory device 130. In some embodiments, IO I/F 111 is a Serial Advanced Technology Attachment (SATA) interface and interconnect 142 is a SATA compliant bus coupling memory sub-system 101 to processor 140. A person skilled in the art would appreciate that in some cases, processor 140 is indirectly coupled to memory sub-system 101 via a bus controller (not shown). In other embodiments, other types of I/O interfaces may be used for IO I/F 111. For example, Serial Attached Small Computer System Interface (SCSI) (or simply SAS) may be used for IO I/F 111, and interconnect 142 is a SAS compliant interface; or Peripheral Component Interconnect Express (PCIe) as described in the PCI Express Base 3.0 Specification may be used for IO I/F 111.

While the embodiments of FIG. 1 are illustrated with two distinct components in memory sub-system 101 and processor 140, some embodiments, are provided (for example) only with memory sub-system 101—e.g., wherein an embodiment is some or all of memory controller 110. For example, in some embodiments, memory sub-system 101 and processor 140 are packaged together as a single unit. In other embodiments, memory sub-system 101 and processor 140 are implemented using three dimensional integrated circuit (3D IC) technology where various dies are stacked on each other. Various dies or components of memory sub-system 101 are implemented, for example, as dies that are stacked on a die of processor 140 to form a stacked or 3D IC.

Operation of system 100 includes memory controller 110 variously accessing memory resources of memory device 130 (e.g., including the illustrative memory banks 132a, . . . , 132n shown) on behalf of processor 140. For example, one or more of memory banks 132a, . . . , 132n each include a respective single or multi-threshold level NAND flash memory (as described with reference to FIGS. 3-4), NOR flash memory, single or multi-level phase change memory (PCM), a three dimensional cross point memory, a resistive memory, nanowire memory, ferro-electric transistor random access memory (FeTRAM), magnetoresistive random access memory (MRAM) memory that incorporates memristor technology, spin transfer torque (STT)-MRAM, or a combination of any of the above, etc.

In some embodiments, memory controller 110 includes encoder 112, write logic 113, read logic 114, and circuitry EDC 120 which is to provide error detection/correction functionality. In some embodiments, encoder 112 applies an encoding scheme to the input data, data in, which is received from processor 140 (or other such data source). Such encoding generates encoded data (i.e., codewords) which facilitates error detection/correction. Each codeword includes a data portion and a corresponding error detection (in this example, parity) portion. In some embodiments, the error correction scheme is one of a low density parity check (LDPC) scheme, a Turbo code scheme, or a Reed-Solomon code scheme.

In some embodiments, the encoded codeword is written to memory device 130 by write logic 113. In some embodiments, write logic 113 includes any suitable driver to drive data for writing to memory device 130. In some embodiments, memory controller 110 communicates with memory device 130 (i.e., the various memory dies) via an Input/Output (I/O) interface and corresponding compliant bus. In some embodiments, memory controller 110 communicates with memory device 130 via an interface which is complaint to the Open NAND Flash Interface (ONFI) specification (e.g., Revision 4.0 released Apr. 2, 2014). In other embodiments, any of various other types of interfaces are used for communication between memory controller 110 and memory device 130.

So as not to obscure various embodiments, encoder 112 is described as an LDPC encoder, and EDC 120 is described as providing LDPC decoder functionality. However, other types of suitable non-volatile memories, encoders, and decoders may be used. In some embodiments, read logic 114 is operable to read the encoded data from the one or more memory banks from memory device 130. Read logic 114 may be implemented using any suitable read circuits.

Circuitry EDC 120 comprises read logic 114 coupled to receive a data communication which is provided to memory controller 110 by memory device 130—e.g., wherein the communication represents bits of a codeword. In an embodiment, such a communication comprises data signals (e.g., communicated serially, or in parallel with each other) which each indicate a corresponding codeword bit. For each of the data signals, a respective characteristic thereof (in this example embodiment, the characteristic including a voltage level) indicates a logic state of the corresponding codeword bit—e.g., where the logic state is one of a logic low ("0") state or a logic high ("1") state. In one such embodiment, read logic 114 provides functionality to identify or otherwise indicate, to other circuitry of EDC 120, the respective voltage levels which are detected for each of the codeword bits.

For example, EDC 120 further comprises likelihood determination logic 124 which performs, or otherwise facilitates, the determining of bit reliability information based on data signal voltage levels detected by read logic 114. In an embodiment, determining such bit reliability information comprises accessing reference information and/or performing a calculation to determine, for each of the data signal voltage levels, a respective soft reliability value for the corresponding codeword bit. A given soft reliability value is, for example, in a range of possible soft reliability values—e.g., wherein a likelihood function corresponds different data signal voltage levels each with a respective value of a likelihood metric. In the example embodiment shown, likelihood determination logic 124 provides functionality to identify or otherwise indicate that a particular likelihood function—e.g., one of multiple available likelihood functions LKa, . . . , LKx—is to be used for determining soft reliability values for various bits of a codeword.

In an embodiment, soft reliability values which are generated based on one such likelihood function (e.g., function LFa) at syndrome calculation logic 122 of EDC 120. In other embodiments, such soft reliability values are calculated at likelihood determination logic 124, and then communicated to syndrome calculation logic 122. Syndrome calculation logic 122 comprises a field programmable gate array, application specific integrated circuit, state machine and/or other circuitry which is suitable to provide parity check functionality that, for example, corresponds to a parity check matrix. For example, syndrome calculation logic 122 implements functionality of interconnected nodes which variously communicate with each other, and perform respective calculations which facilitate a parity check evaluation of the bit reliability information. In an example embodiment, such nodes comprise "bit nodes" (also referred to as "message nodes") and "check nodes" which are each coupled to a respective one or more of the bit nodes. The bit nodes are each to receive a respective soft reliability value of the bit reliability information, and to variously communicate, to one or more check nodes, respective signals based on the respective soft reliability value.

In some embodiments, operation of syndrome calculation logic 122 comprises first signals being variously communicated each from a respective bit node to a respective check node, where the first signals are each based on a respective soft reliability value. Based on the first signals, the check nodes variously calculate values which are then variously communicated each from a respective check node to a respective bit node. In some embodiment, such communications and calculations include one or more operations adapted from conventional LDPC error detection techniques to determine a syndrome vector—e.g., including operations adapted from belief propagation techniques, minimum sum techniques, or the like.

In some embodiments, this sequential communication—including first signals sent to the check nodes and second signals subsequently sent to the bit nodes—is performed iteratively one or more times at syndrome calculation logic 122. After at least one such iteration, parity check values are calculated each for a different respective one of the bit nodes, and a syndrome vector (comprising the parity check values) is determined.

Based on a syndrome which is determined with syndrome calculation logic 122, likelihood determination logic 124, or other suitable logic of EDC 120, determines whether the likelihood function LFa, or some alternative likelihood function, is to be used for error correction of the codeword (assuming such error correction is needed). For example, likelihood determination logic 124 selects one of likelihood functions LFa, . . . , LFx over the others of likelihood functions LFa, . . . , LFx, where such selection is based on a number of bit errors (if any) which are indicated by the syndrome. In one example embodiment, likelihood determination logic 124 includes or otherwise has access to information which corresponds likelihood functions LFa, . . . , LFx each to a different respective range of values of a bit error rate. Where it is determined (for example) that the calculated syndrome vector indicates a bit error rate which is in one such range, the corresponding likelihood function is selected over the others of likelihood functions LFa, . . . , LFx. The selected likelihood function is then identified to error correction logic 126 of EDC 120, which subsequently performs error correction operations based on the selected likelihood function and the data signal voltage levels determined with read logic 114.

Operations by error correction logic 126 to correct bit errors of the codeword include, for example, bit flipping to generate modified bit reliability information, syndrome calculation based on the modified bit reliability information, and syndrome evaluation to determine whether bit flipping performed to-date has resolved all bit errors for the codeword. One or more such operations are adapted, for example, from conventional LDPC (or other) error detection/correction techniques. In some embodiments, error correction logic 126 corrects one or more data errors in a codeword which is read from memory device 130 (e.g., from one or memory banks 132a, . . . , 132n). The corrected output is then provided as output data data_out for processing by processor 140.

Figure 2A:
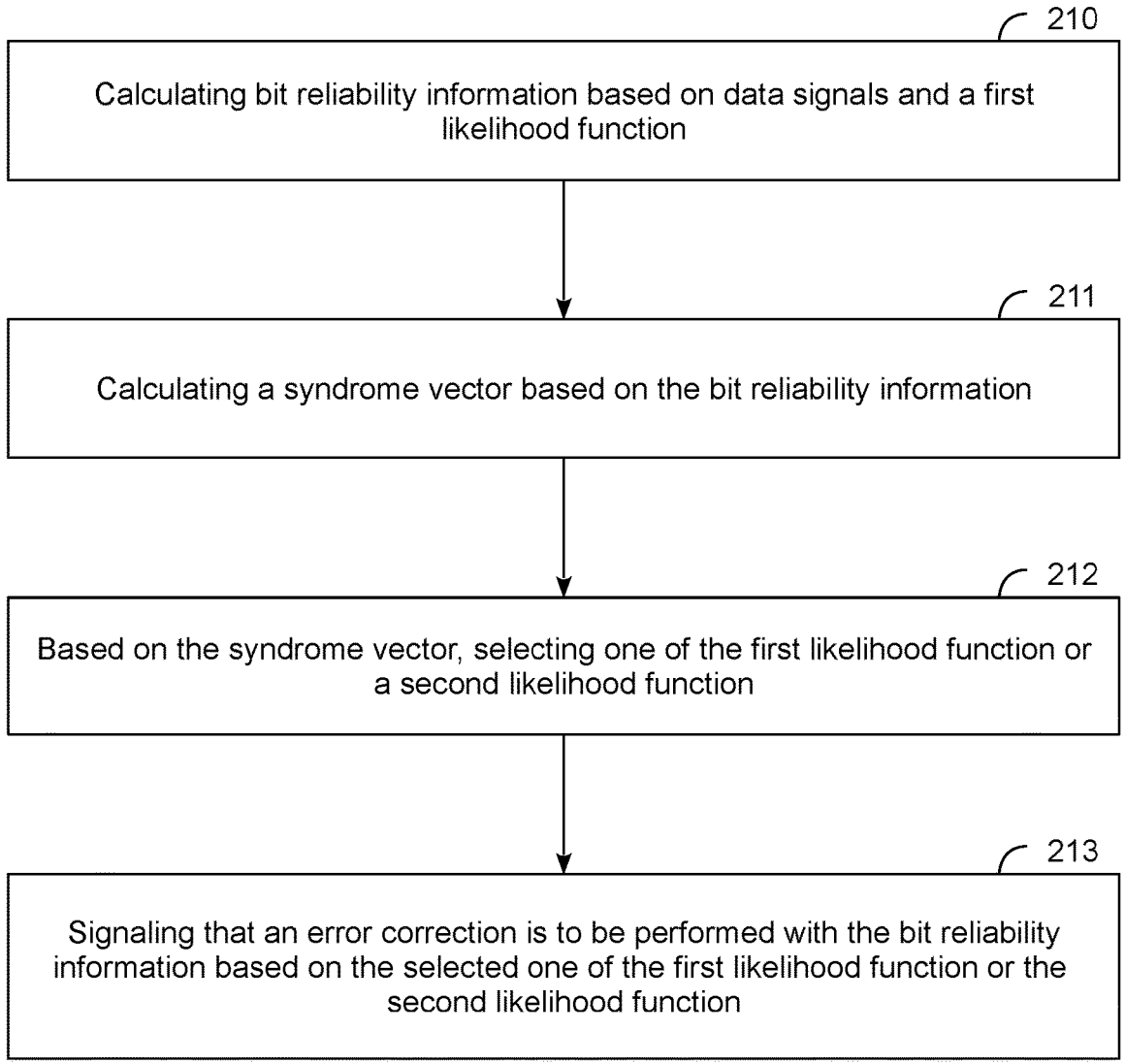
FIGS. 2A, 2B show flow diagrams each illustrating elements of a respective method to determine information for use in an error correction calculation according to a corresponding embodiment.

FIG. 2A shows features of a method 200 to identify bit reliability information which is to be used in an error correction operation according to an embodiment. Method 200 is to operate circuitry of system 100, for example.

As shown in FIG. 2A, method 200 includes (at 210) calculating bit reliability information based on data signals and a first likelihood function. For example, the calculating at 210 includes, or is otherwise based on, a sampling of data signals which each indicate a respective bit of a codeword—e.g., where the codeword includes parity check information that is according to an LDPC error correction encoding scheme. In an embodiment, such sampling of data signals identifies, for each such data signal, a respective level of a signal characteristic (such as a voltage level). In one such embodiment, the calculating at 210 includes, for each of the sampled voltage levels, identifying a corresponding value of a likelihood metric (e.g., a corresponding soft reliability value), where such identifying is based on the first likelihood function. Such a value includes or is otherwise based on a log likelihood ratio (LLR) value, for example.

In some embodiments, the first likelihood function provides a discrete correspondence of at least one voltage range to a respective single likelihood value—e.g., where the first likelihood function corresponds multiple voltage ranges each to a different respective single likelihood value. For example, for a given one such voltage range, the first likelihood function associates any voltage in that voltage range to the same likelihood value. In some embodiments, the first likelihood function is a default likelihood function—e.g., wherein different codewords are variously processed, at least initially, each based on the first likelihood function. In one such embodiment, likelihood values of the default likelihood function are relatively small magnitude values, as compared to corresponding values of another likelihood function which, for example, is selectively made available according to method 200.

Method 200 further comprises (at 211) calculating a syndrome vector based on the bit reliability information. In some embodiments, the calculating at 211 is performed with circuitry—e.g., at syndrome calculation logic 122—which implements nodes which are interconnected according to a parity check matrix. Such nodes include, for example, bit nodes and check nodes variously coupled to said bit nodes, wherein the bit nodes each receive a respective soft reliability value of the bit reliability information. In one such embodiment, the calculating at 211 includes communications between, and calculations by, the various interconnected nodes—e.g., to facilitate belief propagation, minimum sum, or such parity evaluation operations for the codeword.

Method 200 further comprises (at 212) selecting one of the first likelihood function or a second likelihood function, wherein the selecting is based on the syndrome vector which is calculated at 211. In some embodiments, the selecting at 212 is based on a bit error rate which is indicated by the syndrome vector. By way of illustration and not limitation, method 200 is performed with circuitry—such as that of EDC 120—which includes or otherwise has access to reference information (or other configuration state) that corresponds various likelihood functions each with a different range of values for a bit error rate. In one such embodiment, a first range of bit error rate values corresponds to the first likelihood function, and a second range of bit error rate values corresponds to the second likelihood function. Accordingly, the first likelihood function is selected at 212 where it is determined that the syndrome vector calculated at 211 indicates a bit error rate in the first range, or (alternatively) the second likelihood function is selected where the indicated bit error rate is in the second range.

In one embodiment, the selecting at 212 includes selectively operating a multiplexer circuit to provide one of a first signal, which indicates the first likelihood function, or a second signal which indicates the second likelihood function. Additionally or alternatively, the selecting at 212 includes determining whether (or not) a scaling factor is to be variously applied to each of multiple likelihood values of the first likelihood function.

Method 200 further comprises (at 213) signaling that an error correction is to be performed with the bit reliability information based on the selected one of the first likelihood function or the second likelihood function. The signaling at 213 comprises, for example, likelihood determination logic 124 communicating to error correction logic 126 that a particular selected one of likelihood functions LFa, . . . , LFx is to be used in error correction for same codeword detected by read logic 114.

In an embodiment, the error correction indicated by the signaling at 213 comprises calculating a second syndrome vector based on both the data signals and the selected one of the first likelihood function or the second likelihood function. Calculating the second syndrome vector is performed, for example, with circuitry which was previously used to calculate the syndrome at 212—e.g., where such calculation is performed with interconnected circuit nodes that represent a parity check matrix.

In some embodiments, where the second likelihood function is selected at 212, the second syndrome vector is calculated based on second bit reliability information which is calculated based on the data signals and the second likelihood vector. Calculation of such second bit reliability information includes features of the calculating at 210, for example. In an alternate embodiment where the first likelihood function is selected at 212, the second syndrome vector is calculated based on a modified version of the bit reliability information which is calculated at 210. Such modified bit reliability information is determined, in some embodiments, by flipping (changing a sign, for example) or otherwise modifying a soft reliability value which, as compared to one or more other soft reliability values, has a relatively low reliability.

In some embodiments, error correction indicated by the signaling at 213 further comprises evaluating whether any bit errors are indicated by such a second syndrome vector. One or more additional iterations of bit flipping, syndrome calculation and syndrome evaluation can be selectively performed—e.g., until a determination has been made that the bit flipping performed to-date has resolved all bit errors in the codeword.

Figure 2B:
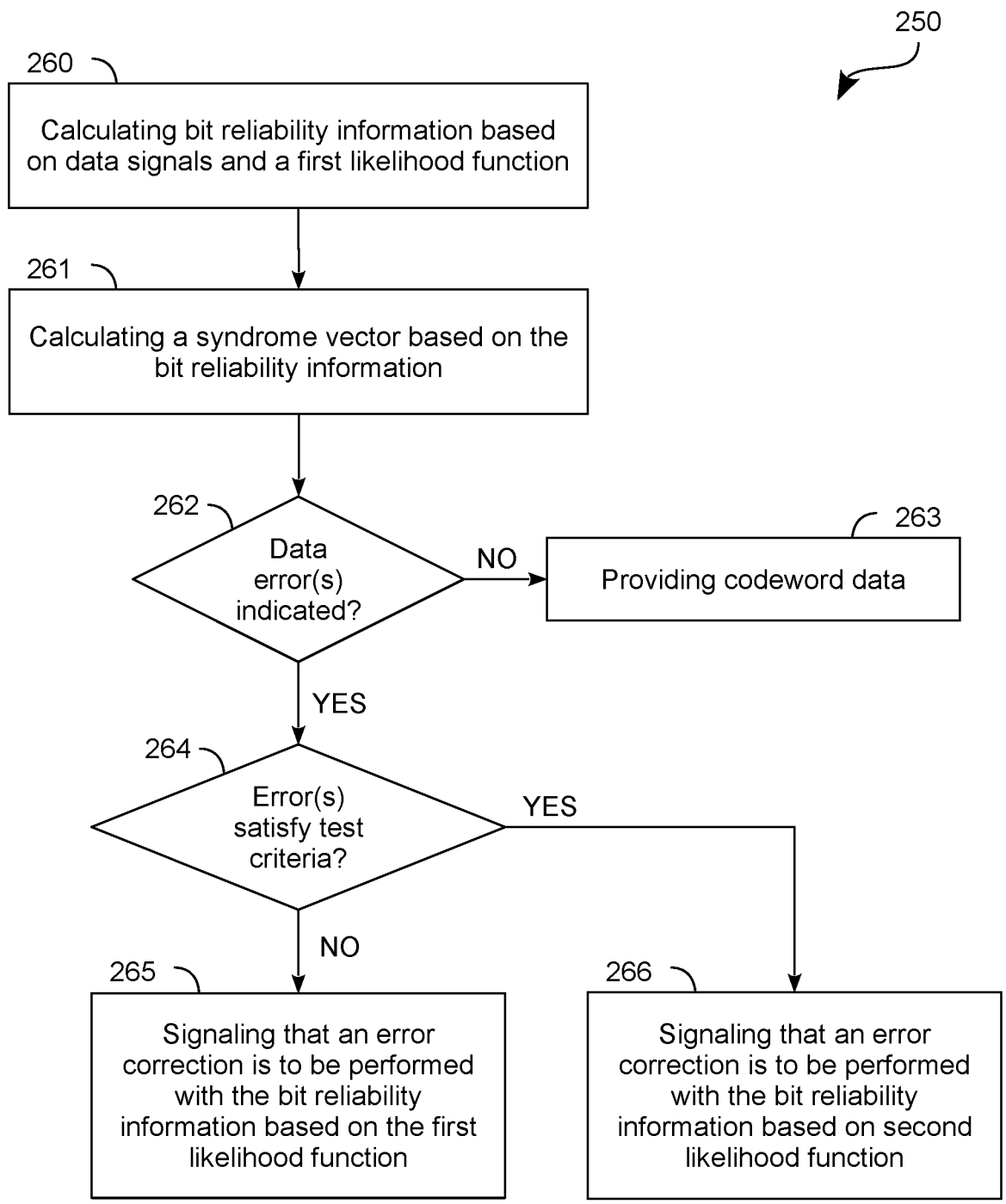

FIG. 2B shows features of a method 250 to identify bit reliability information which is to be used in an error correction operation according to an embodiment. Method 250 is one example of an embodiment to operate circuitry such as that of system 100, for example—e.g., where method 250 includes some or all operations of method 200.

As shown in FIG. 2B, method 250 includes (at 260) calculating bit reliability information based on data signals and a first likelihood function, and (at 261) calculating a syndrome vector based on the bit reliability information. In some embodiments, the respective calculating at 260 and 261 comprises some or all features of the calculating at 210 and 211. For example, the calculating at 260 includes, or is otherwise based on, a sampling of data signals which each indicate a respective bit of a codeword—e.g., where the syndrome vector 261 indicates whether the codeword includes one or more data errors.

Method 250 further comprises determining (at 262) whether one or more data errors are indicated by the syndrome vector which is calculated at 261. Where it is determined at 262 that the syndrome vector indicates no such data errors, method 250 (at 263) provides codeword data which is represented by the data signals—e.g., wherein the codeword data comprises hard bit values each corresponding to a respective one of the data signals.

However, where it is instead determined at 262 that the syndrome vector indicates one or more data errors, method 250 further determines (at 264) whether the one or more data errors satisfy a test criteria which is associated with a particular likelihood function of multiple possible likelihood functions. In one embodiment, the test criteria includes the condition of a bit error rate (which is indicated by the syndrome vector) being in a particular range of values which is identified as corresponding to the particular likelihood function. In the example embodiment shown, the test criteria is a condition for the use of a second likelihood function—e.g., in lieu of the first likelihood function being used—as a basis for additional processing to correct one or more bit errors of a codeword which is represented by the data signals.

For example, where it is determined at 264 that the one or more data errors satisfy the test criteria, method 250 signals (at 265) that an error correction is to be performed with the bit reliability information, where the error correction is to be based on the first likelihood function. However, where it is instead determined at 264 that the one or more data errors do not satisfy the test criteria, method 250 signals (at 266) that an error correction is to be performed with the bit reliability information, where the error correction is to be based on the second likelihood function.

Figure 3A:
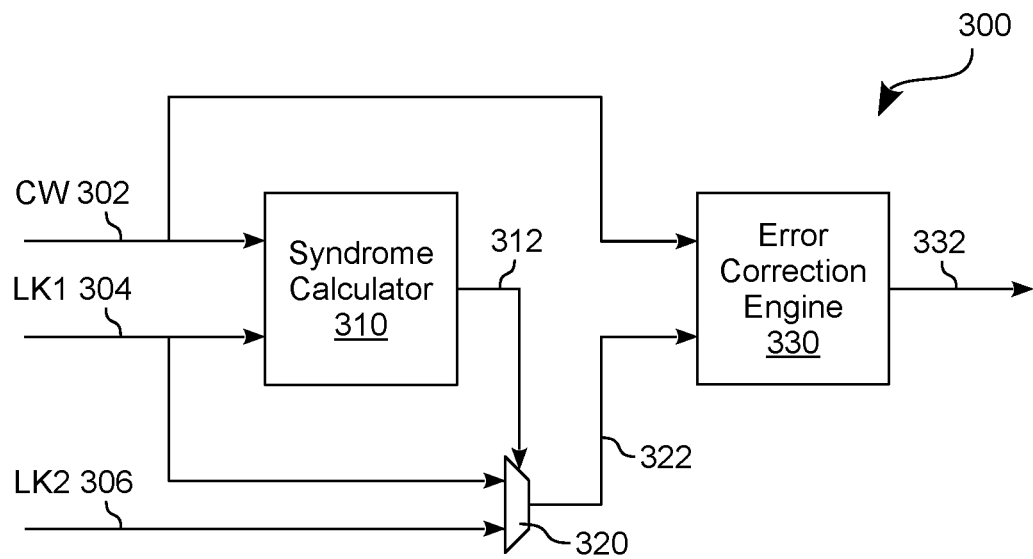
FIGS. 3A, 3B show functional block diagrams each illustrating elements of a respective circuit to determine information for use in an error correction calculation according to a corresponding embodiment.

FIG. 3A shows features of a circuit 300 to perform error correction based on the selection of a likelihood function according to an embodiment. Circuit 300 includes some or all of the features of circuitry EDC 120, for example. In an embodiment, circuitry 300 is operated according to one of methods 200, 250.

As shown in FIG. 3A, circuit 300 includes circuitry (such as the illustrative syndrome calculator 310 shown) that is coupled to receive one or more signals CW 302 which indicate bits of a codeword. For example, CW 302 includes or otherwise indicates respective characteristics (e.g., voltage levels) of data signals which each represent a respective codeword bit. Syndrome calculator 310 is further coupled to receive a signal LK1 304 which includes or otherwise indicates a first likelihood function.

Based on CW 302 and LK1 304, syndrome calculator 310 performs operations including, for example, the various calculating at 210, 211 of method 200 (or, in some embodiments, the various calculating at 260, 261 of method 250). In one such embodiment, syndrome calculator 310 provides some of all of the functionality of syndrome calculation logic 122—e.g., wherein LK1 304 is provided by likelihood determination logic 124. Calculation of a syndrome vector at syndrome calculator 310 includes, for example, one or more operations which are adapted from conventional LDPC error correction techniques.

Circuit 300 for the comprises circuitry, such as the illustrative multiplexer 320 shown, which is operable to select between di☐erent likelihood functions—for example, by selectively communicating (or foregoing communication of) a signal which includes, indicates or is otherwise based on a given likelihood function. In the example embodiment shown, multiplexer 320 is coupled to receive both LK1 304 and another signal LK2 306 which includes or otherwise indicates a second likelihood function.

Based on the syndrome vector which is calculated using CW 302 and LK1 304, syndrome calculator 310 generates a control signal 312 which is to determine a selection, by multiplexer 320, of a particular one of the first likelihood function indicated by LK1 304 or the second likelihood function indicated by LK2 306. In one such embodiment, control signal 312 specifies or otherwise indicates a total number of bit errors (if any) which are indicated by the calculated syndrome vector. For example, control signal 312 specifies or otherwise indicates that the codeword has no data errors or, alternatively, that the codeword has one or more data errors, a total number of which is in a particular one of a first range of values and a second range of values. In an embodiment, the first range of values and the second range of values correspond, respectively, to the first likelihood function and the second likelihood function (e.g., to LK1 304 and LK2 306, respectively).

Based on control signal 312, multiplexer 320 outputs a signal 322 which indicates, to an error correction engine 330 of circuit 300, a selected one of LK1 304 or LK2 306 (e.g., where signal 322 thus indicated a particular selected one of the first likelihood function or the second likelihood function). Based on both CW 302 and the selected likelihood function which is indicated signal 322, error correction engine 330 performs additional operations to correct the one or more bit errors of the codeword. Such additional operations include, for example, selective bit flipping, and syndrome vector calculation/evaluation to determine whether the bit flipping performed to-date has fixed all bit errors in the codeword. A resulting error-corrected codeword 332 is then output by error correction engine 330—e.g., wherein the error-corrected codeword 332 is to be provided to processor 140 or other such data sink (not shown) that is included in or coupled to circuit 300.

Figure 3B:
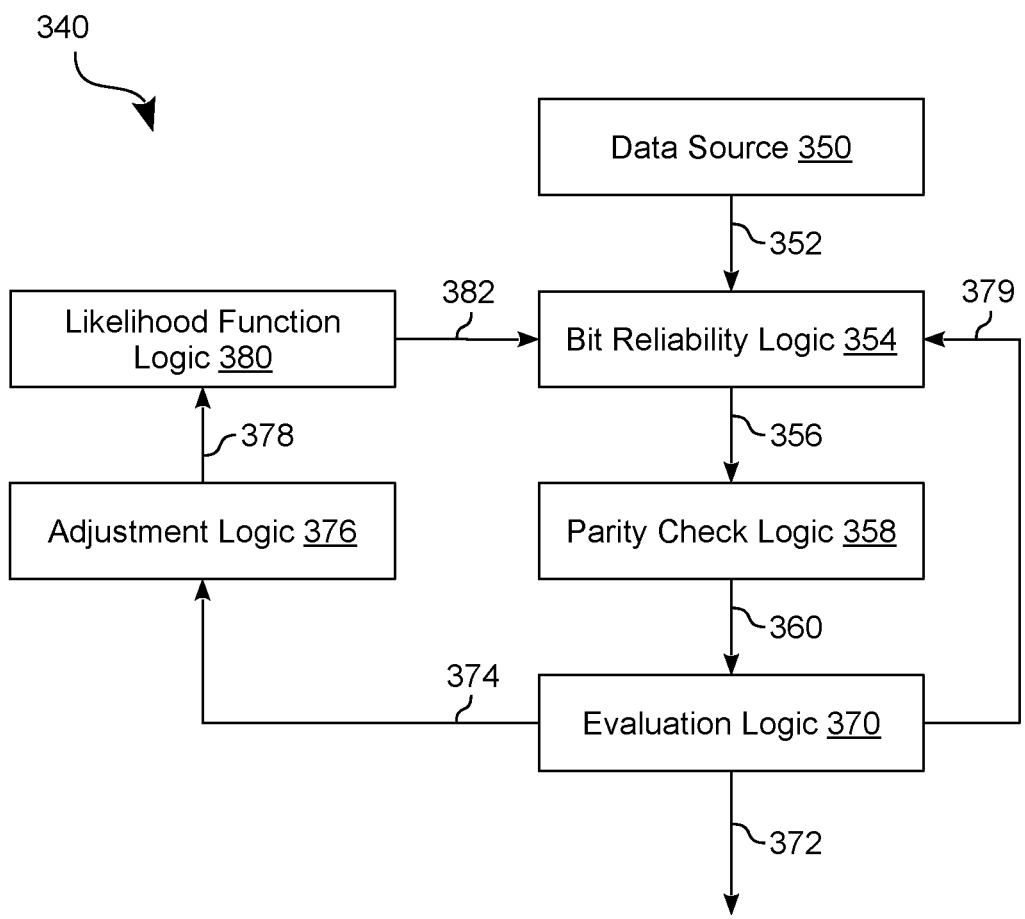

FIG. 3B shows features of a circuit 340 to perform error correction based on bit reliability information which is determined according to another embodiment. Circuit 340 includes features of circuitry EDC 120 or circuit 300, for example. In some embodiment, circuitry 340 is operated according to one of methods 200, 250.

As shown in FIG. 3B, circuit 340 includes (or alternatively, is to couple to) a data source 350—such as memory device 130—which provides signals 352 each representing a respective bit of a codeword. For example, signals 352 are communicated in parallel or, alternatively, in series with each other via a common data signal line.

Circuit 340 further comprises bit reliability logic 354 which is coupled to receive and variously sample signals 352—e.g., wherein circuitry of bit reliability logic 354 determines respective voltage levels for signals 352, the voltage levels each indicating a logic state of a corresponding codeword bit. In some embodiments, bit reliability logic 354 is further coupled to receive a signal 382 which indicates a particular likelihood function (e.g., one of two or more likelihood functions which are supported with circuit 340). Signal 382 is provided, for example, by likelihood function logic 380 which keeps track of a current likelihood function to be used for determining bit likelihood information. In one such embodiment, processing by bit reliability logic 354—e.g., including initial decode processing for a given codeword—is based on signal 382 indicating a first likelihood function which, for example, is a default likelihood function.

For example, based on the various voltage levels of signals 352, and further based on the first likelihood function indicated by signal 382, bit reliability logic 354 calculates or otherwise identifies first bit reliability information. The first bit reliability information comprises first soft reliability values which each correspond to a different respective bit of the codeword represented by signals 352. Bit reliability logic 354 communicates the first bit reliability information, with a signal 356, to parity check logic 358 of circuit 340. In an embodiment, parity check logic 358 provides functionality, such as that of syndrome calculation logic 122 or syndrome calculator 310, to calculate a first syndrome vector based on such first bit reliability information. The first syndrome vector is communicated, with a signal 360, to evaluation logic 370 which (for example) performs the determining at 262 and/or the determining at 264 of method 250.

For example, in one embodiment, evaluation logic 370 determines whether any bit errors of the codeword are indicated by the first syndrome vector. Where evaluation logic 370 determines that no such bit errors are indicated, error free data 372 is communicated from evaluation logic 370 to some data sink (not shown) which is included in—or alternatively, coupled to—circuit 340. However, where evaluation logic 370 instead determines that the syndrome vector indicates one or more bit errors of the codeword, a signal 374 is provided to adjustment logic 376 of circuit 340. Adjustment logic 376 comprises circuitry to determine whether a total number of bit errors (as indicated by the first syndrome vector) corresponds to a particular likelihood function of two or more likelihood functions which are supported with circuit 340.

In one example scenario, adjustment logic 376 determines that the total number of bit errors (or, for example, a bit error rate corresponding thereto) is within a range that corresponds to a second likelihood function—i.e., other than the first likelihood function which was initially indicated with signal 382. Based on such as determination, adjustment logic 376 communicates, via a signal 378, that likelihood function logic 380 is to transition to indicating the second likelihood function with signal 382—e.g., in lieu of indicating the first likelihood function.

In an alternative scenario, adjustment logic 376 determines that the total number of bit errors (or, for example, a bit error rate corresponding thereto) is within another range that corresponds to the first likelihood function. Based on such as determination, adjustment logic 376 foregoes communicating via a signal 378 that likelihood function logic 380 is to transition to indicating the second likelihood function via signal 382. For example, adjustment logic 376 foregoes any communication with likelihood function logic 380, or (alternatively) communicates via signal 378 that likelihood function logic 380 is to continue indicating the first likelihood function with signal 382.

In some embodiments, where evaluation logic 370 determines that the syndrome vector indicates one or more bit errors of the codeword, evaluation logic 370 further communicates to bit reliability logic 354 a signal 379 which indicates that second bit reliability information is to be calculated based on the signals 352 (i.e., based on the same codeword which is indicated with signals 352).

Such second bit reliability information is determined, for example, based on a likelihood function which is currently indicated by signal 382—e.g., where the likelihood function is different than that which was initially indicated for processing signals 352. In some embodiments, generating the second bit reliability information comprises bit reliability logic 354 flipping or otherwise modifying one or more soft reliability values—e.g., including a soft reliability which, as compared to one or more other soft reliability values, has a relatively low reliability.

Based on the second reliability information, syndrome calculation and bit error detection is performed with parity check logic 358 and evaluation logic 370 to determine whether the bit flipping performed to-date has corrected the one or more bit errors of the codeword. In some embodiments, one or more additional iterations of bit flipping, syndrome calculation and bit error detection are sequentially performed (as necessary) until error free data 372 is identified by, and communicated from, evaluation logic 370.

Figure 4:
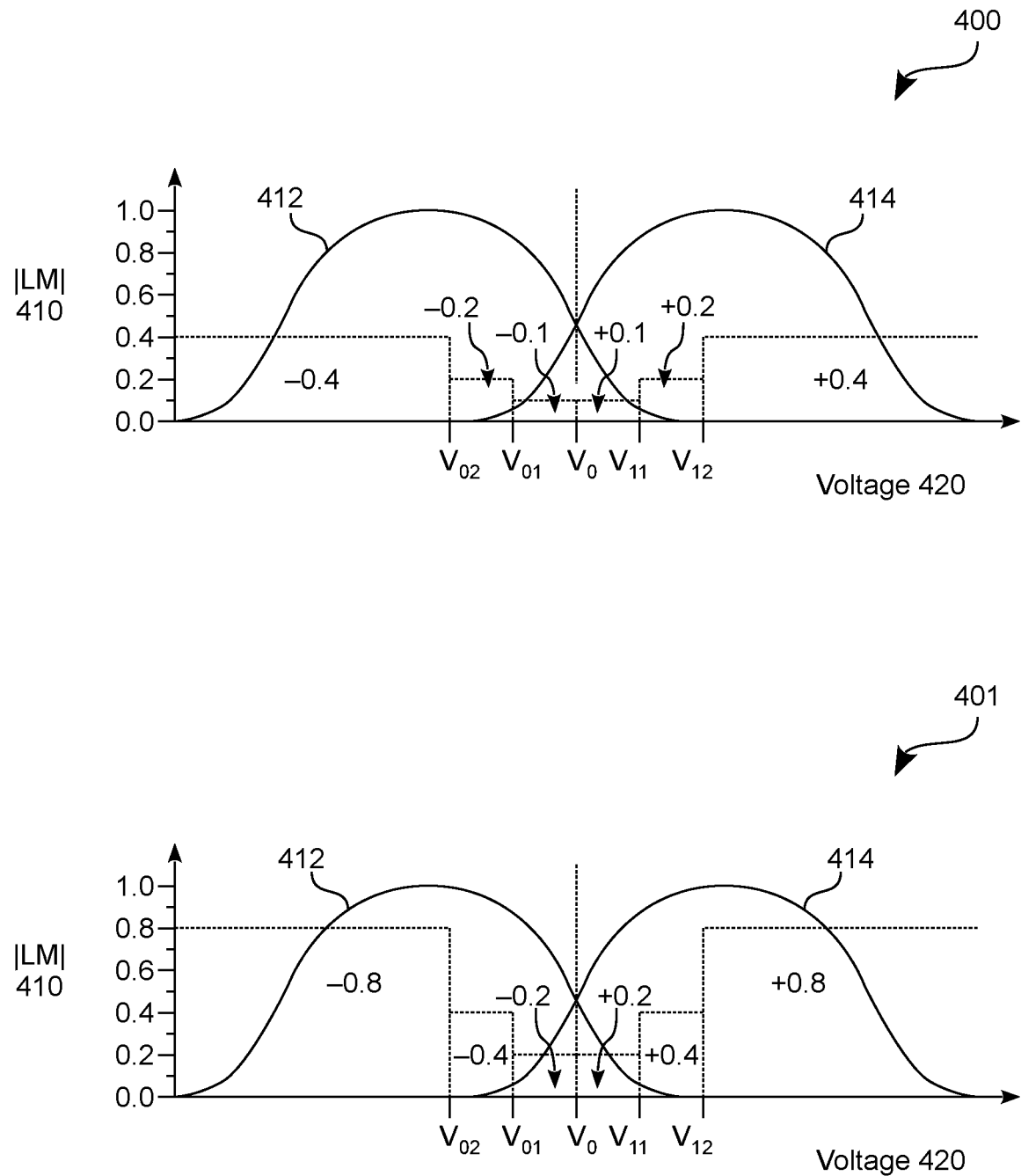
FIG. 4 shows graphs variously illustrating elements of likelihood functions which are available to be used in an error correction calculation according to an embodiment.

FIG. 4 shows graphs 400, 401 of respective likelihood functions which are available to be selected for data error correction according to an embodiment. Likeability functions such as those illustrated in graphs 400, 401 are available to be selected, for example, according to one of methods 200, 250. In some embodiments, reliability information is determined based on such selection—e.g., where said determining is performed by one of circuitry EDC 120, circuit 300, or circuit 340, for example.

In each of graphs 400, 401, an axis |LM| 410 represents the absolute value of a likelihood metric (LM) which, for example, is to be a soft reliability value of a given codeword bit. For example, graph 400 shows values of the metric LM which, according to a first likelihood function, vary along a range of values of a voltage 420. By contrast, graph 401 shows a different variation of metric LM, with respect to voltage 420, which is according to a second likelihood function.

In some embodiments, voltage 420 is a voltage level of a given data signal which represents a logic state of a particular codeword bit. For example, superimposed on each of graphs 400, 401 are two curves 412, 414 which variously indicate, for a low logic state and a high logic state (respectively), corresponding probability distributions each along the range of values for voltage 420. Curve 412 represents a distribution of voltage levels which are identified by multiple samplings each of a respective data bit which is at a logic low ("0") state. By contrast, curve 414 represents a distribution of voltage levels which are identified by multiple samplings each of a respective data bit which is at a logic high ("1") state. A voltage level $V_0$ of voltage 420 corresponds to a point of intersection of curves 412, 414—e.g., wherein $V_0$ corresponds to a bit having equal likelihood of being at either a logic low state or a logic high state.

In some embodiments, multiple voltage levels variously delineate sub-ranges in the range of voltage 420—e.g., where, in the example of graph 400, five voltage levels $V_{02}$, $V_{01}$, $V_0$, $V_{11}$, and $V_{12}$ delineate six such sub-ranges from each other. According to the first likelihood function shown in graph 400, $V_0$ is between sub-ranges which correspond to a logic low ("0") state, and other sub-ranges which correspond to a logic high ("1") state. For example, according to the first likelihood function, a given bit is to be assigned one of multiple soft reliability values, where the assigning is based on the sub-range which includes the voltage level of a data signal that represents the given bit. In the example embodiment shown, the multiple soft reliability values include −0.4, −0.2, −0.1, +0.1, +0.2, and +0.4. In one such embodiment, the sign of a soft bit value indicates a more likely logic state of a given bit—e.g., where a positive (+) sign indicates that at a logic high ("1") state is more likely, or where a negative (−) sign indicates that at a logic low ("0") state is more likely. Furthermore, a magnitude (e.g., absolute value) of such a soft reliability value indicates a degree of confidence in the more likely logic state.

By contrast, according to the second likelihood function shown in graph 401, different soft reliability values variously correspond each to a respective one of the same voltage sub-ranges (or alternatively, different voltage sub-ranges) in the range of values for voltage 420. For example, soft reliability values which are available to be assigned, according to the second likelihood function, include −0.8, −0.4, −0.2, +0.2, +0.4, and +0.8. As variously illustrated in graphs 400, 401, a given likelihood function (in some embodiments) changes stepwise along the range of values for voltage 420.

Likelihood functions such as those represented in graphs 400, 401 include (for example) one function which is designated as a default likelihood function for use in calculating a syndrome vector. In one such embodiment, likelihood values of the default likelihood function are of relatively small magnitude, as compared to corresponding values of another likelihood function which is selectively available for error correction. For example, in an illustrative scenario according to one embodiment, first bit reliability information—calculated based on the function of graph 400—comprises first values which each correspond to a different respective bit of a codeword. By contrast, a subsequent error correction for that same codeword (the error correction based on the likelihood function of graph 401) comprises calculating second bit reliability information including second values which each correspond to a different respective one of the first values. In one such embodiment, an average magnitude of the first values is less than an average magnitude of the second values.

Some embodiments are not limited to the particular voltage sub-ranges, or the corresponding soft reliability values, which are defined by the first likelihood function in graph 400, or the second likelihood function in graph 401. Other embodiments variously provide for additional or alternative voltage sub-ranges and/or corresponding soft reliability values. For example, the second likelihood function shown in graph 401 is a linearly scaled version of the first likelihood function shown in graph 400, although some embodiments are not limited in this regard. In one such embodiment, selecting between two likelihood functions—e.g., at 212 of method 200—comprises determining whether to apply a scalar multiplier to a first likelihood function.

Figure 5:
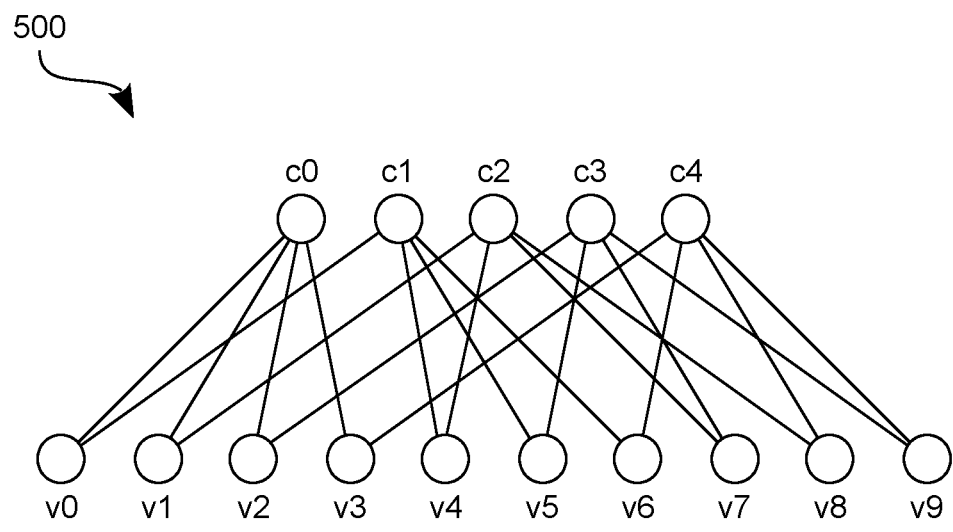
FIG. 5 shows a Tanner graph illustrating elements of a decoder to detect data errors according to an embodiment.

FIG. 5 shows a Tanner graph 500 illustrating functionality, to be provided with a decoder circuit, which is based on bit reliability information that is determined by selecting a likelihood function according to an embodiment. In some embodiments, syndrome calculation—e.g., by syndrome calculation logic 122, syndrome calculator 310, or parity check logic 358—is provided at least in part with LDPC circuitry which implements a Tanner graph such as Tanner graph 500.

As illustrated in FIG. 5, Tanner graphs are (for example) bipartite graphs comprising bit nodes (BNs) and check nodes (CNs), where each BN is connected to one or more CNs via bidirectional edges. The bidirectional edges for each BN and each CN is similarly defined by the non-zero elements of a parity check matrix (such as the illustrative matrix H 510 shown)—e.g., where e.g. c0 (check node 0) is bidirectionally connected to v0 (bit node 0), v1 (bit node 1), v2 (bit node 2), and v3 (bit node 3).

Syndrome calculation—e.g., with parity check circuitry such as that represented by Tanner graph 500—includes BNs (for example, including v0 through v9) receiving respective soft reliability values each for a respective bit of a codeword. Said BNs each communicate, to various CNs which are coupled thereto, respective signals which are based on the corresponding soft reliability value. Each CN thus receives inputs from each connected BN, and calculates a corresponding parity check equation. Results of such parity check equation are variously communicated by the CNs back to the BNs, whereupon an evaluation is made to determine if a parity check condition is satisfied.

Figure 6:
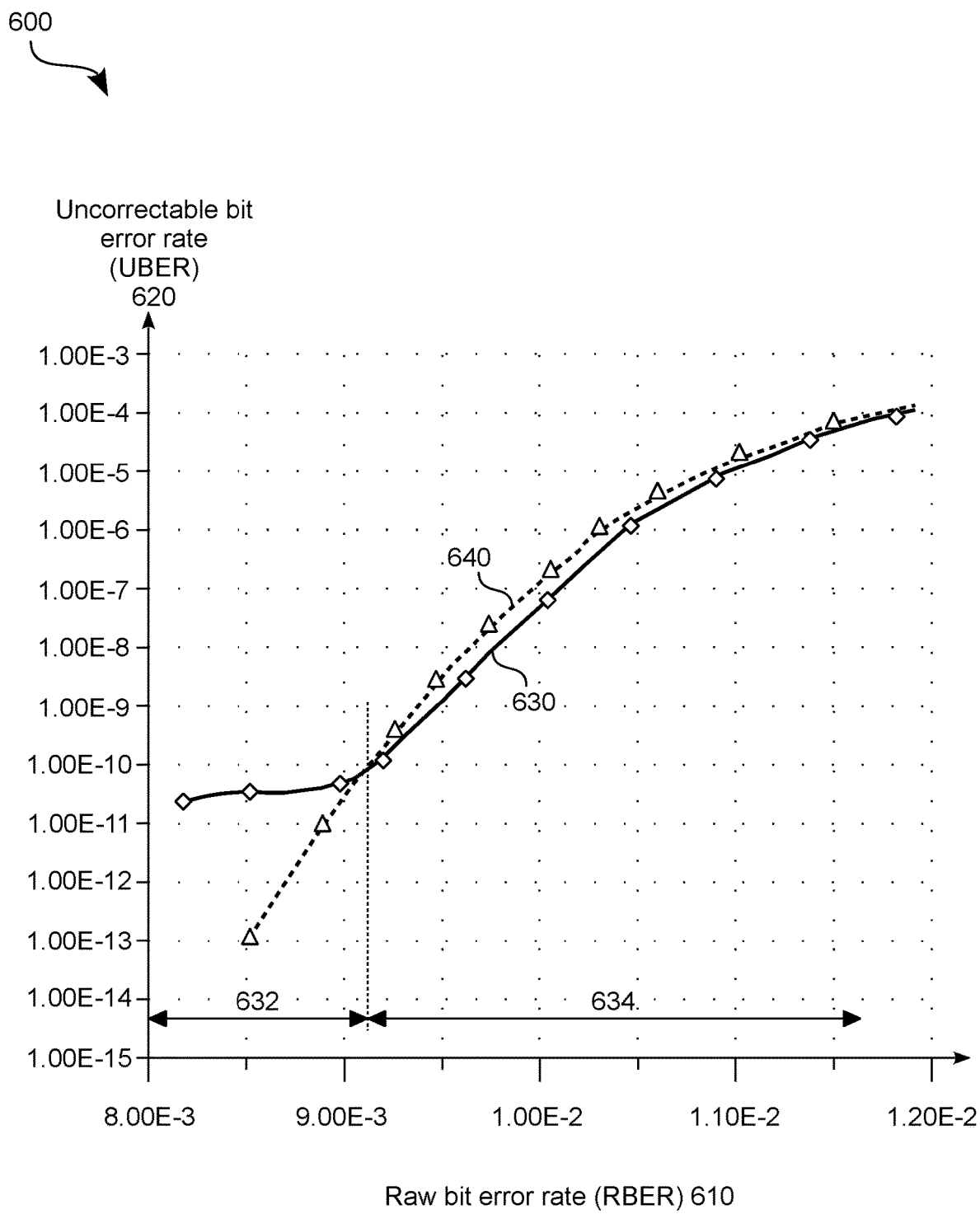
FIG. 6 shows a graph illustrating respective conditions under which likelihood functions are to be variously used in error correction calculations according to an embodiment.

FIG. 6 shows a graph 600 illustrating different conditions under which likelihood functions are to be variously used for error correction according to an embodiment. Graph 600 shows curves 630, 640 which each represent a respective relationship of an uncorrectable bit error rate (UBER) 620 of codeword data respect to a raw bit error rate (RBER) 610 of said codeword data. For example, curves 630, 640 represent (respectively) bit error rates which are variously detected using a first likelihood function, and bit error rates which are variously which are detected using a second likelihood function Graph 600 further shows various regions of curve 630, as related to certain sub-ranges 632, 634 in the range of values for RBER 610. For example, curve 630 has an "error floor" region, and a "waterfall" region (in sub-ranges 632, 634, respectively), where an average slope of the error floor region is relatively more shallow than that of the waterfall region. Due in part to these regions, curve 630 (as compared to curve 640) illustrates relatively better error correction performance in sub-range 634, whereas curve 640 illustrates relatively better error correction performance in sub-range 632.

Some embodiments variously provide improved error correction performance by selectively transitioning (or foregoing a transition)—according to the given situation—between the use of one likelihood function for evaluating a codeword, and the use of a different likelihood function for error correction of that same codeword. For example, where a syndrome vector for a given codeword indicates a bit error rate which is in sub-range 632, some embodiments make a determination that error correction (if any) for that codeword is to be performed using the likelihood function which is represented by curve 640. By contrast, where such a syndrome vector instead indicates a bit error rate in sub-range 634, some embodiments additionally or alternatively determine that error correction (if any) for the codeword is to be performed using the likelihood function which is represented by curve 630. Such selecting of a likelihood function is performed, for example, according to one of methods 200, 250—e.g., wherein the selecting is performed with EDC 120 or one of circuits 300, 340.

Figure 7:
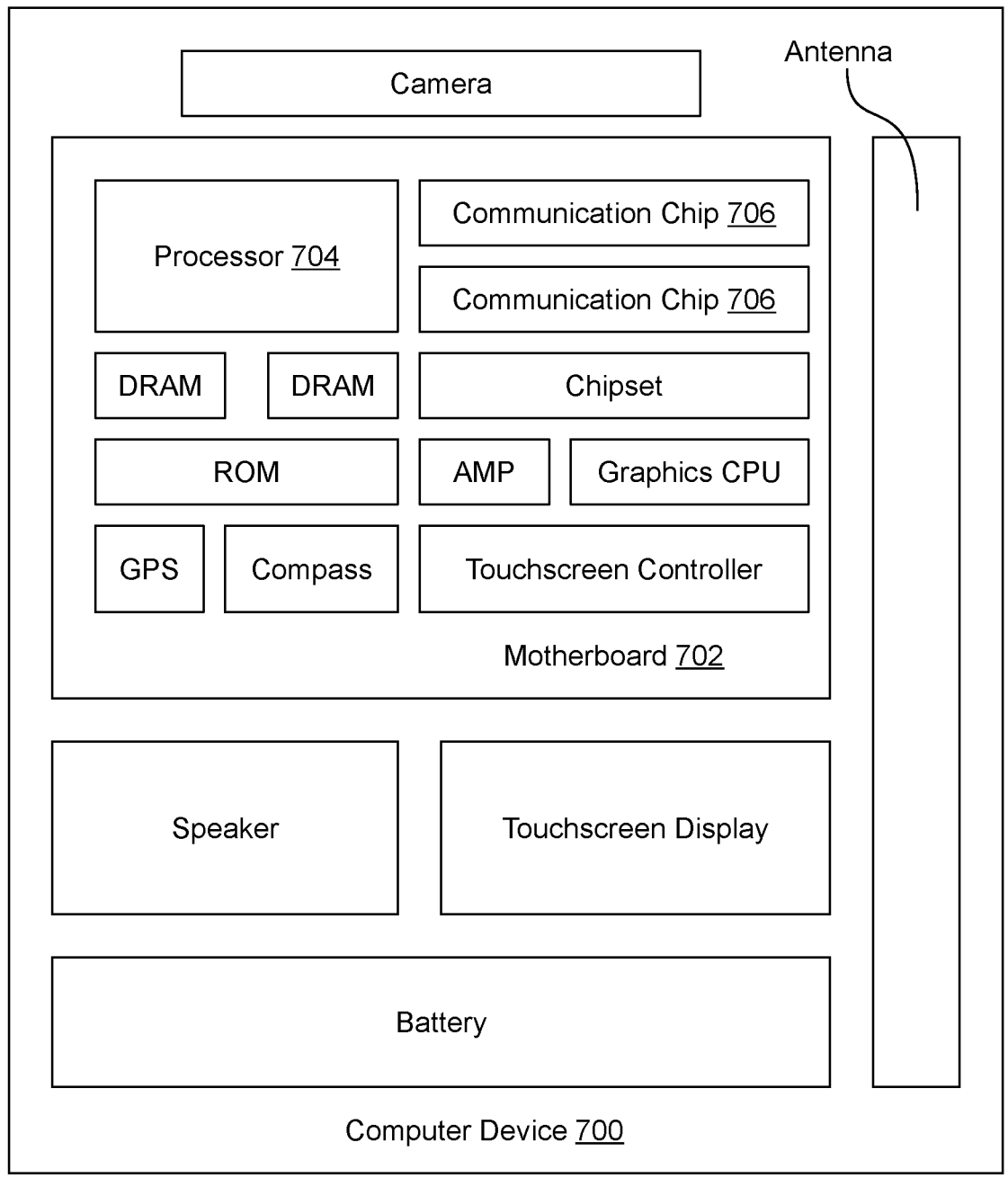
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
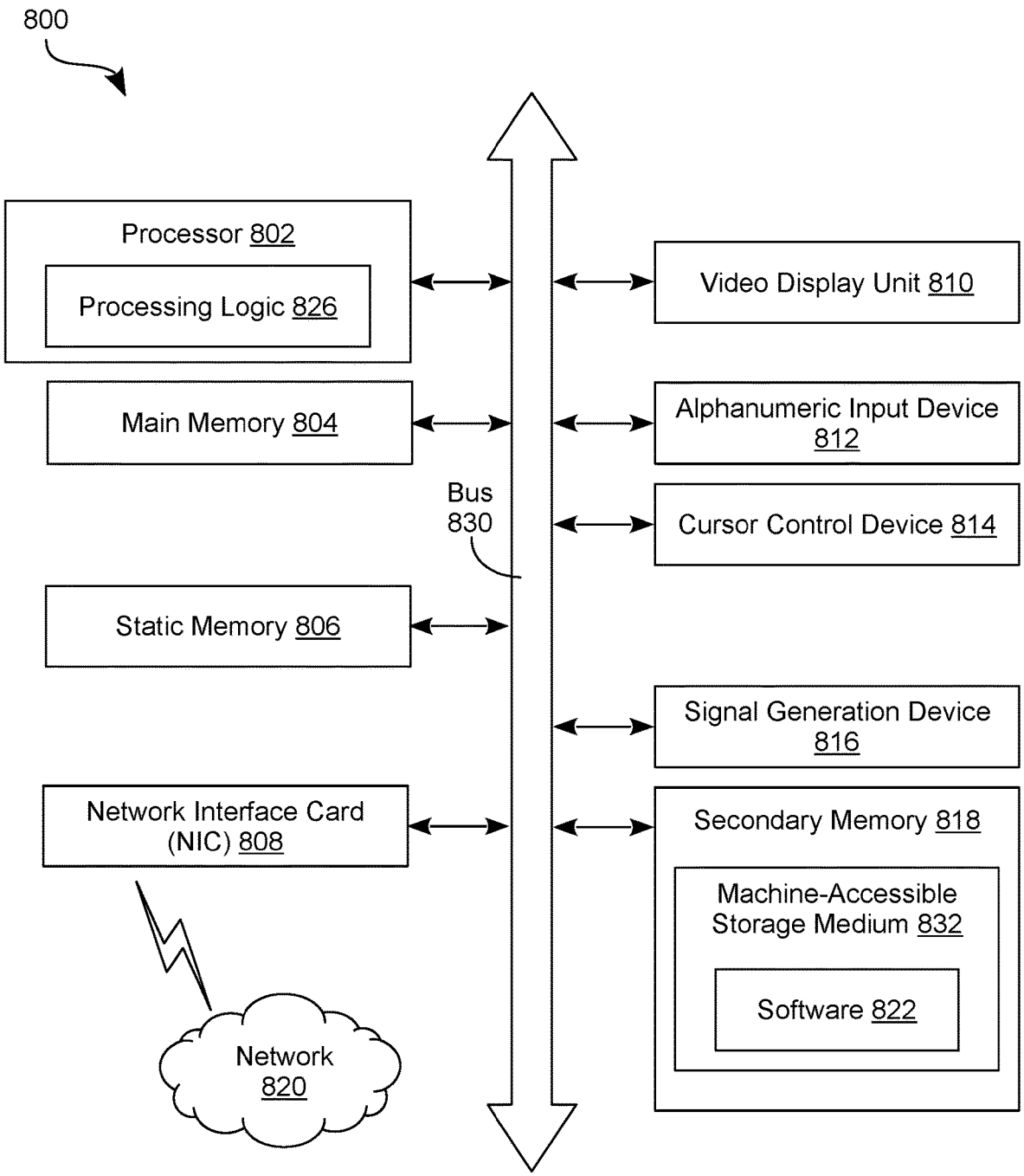
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for detecting data errors are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   first circuitry to calculate first bit reliability information based on data signals and a first likelihood function, wherein the data signals each indicate a respective bit of a codeword, wherein the first bit reliability information comprises first values which each correspond to a different respective bit of the codeword, wherein the first likelihood function is a default likelihood function;
   second circuitry to calculate a syndrome vector based on the first bit reliability information;
   third circuitry to select, based on the syndrome vector, one of the first likelihood function or a second likelihood function, and to signal that an error correction is to be performed, based on the selected one of the first likelihood function or the second likelihood function, with one of the first bit reliability information or second bit reliability information; and
   fourth circuitry to perform the error correction based on the second likelihood function, comprising circuitry to calculate the second bit reliability information based on the data signals and the second likelihood function, wherein the second bit reliability information is to comprise second values which each correspond to a different respective one of the first values, wherein an average magnitude of the first values is less than an average magnitude of the second values.

2. The device of claim 1, wherein a value of the first bit reliability information is based on a log likelihood ratio value.

3. The device of claim 1, wherein the codeword is encoded according to a low density parity check scheme.

4. The device of claim 1, wherein the third circuitry comprises circuitry to multiplex between a first signal which indicates the first likelihood function, and a second signal which indicates the second likelihood function.

5. The device of claim 1, wherein:
   the first values are each in a range of possible values which each indicate a respective confidence that a given data signal indicates one of a first logic state or a second logic state, the possible values comprising more than two values; and
   the second values are each in the range of possible values.

6. The device of claim 1, wherein the third circuitry comprises circuitry to determine whether to apply a scalar multiplier to the first likelihood function.

7. The device of claim 1, wherein the third circuitry is to select one of the first likelihood function or the second likelihood function based on a bit error rate indicated by the syndrome vector.

8. The device of claim 1, wherein the second circuitry to calculate the syndrome vector comprises circuitry to provide the first bit reliability information to interconnected nodes, the device further comprising fourth circuitry to perform the error correction with the interconnected nodes.

9. A system comprising:
   an integrated circuit comprising:
      first circuitry to calculate first bit reliability information based on data signals and a first likelihood function, wherein the data signals each indicate a respective bit of a codeword, wherein the first bit reliability information comprises first values which each correspond to a different respective bit of the codeword, wherein the first likelihood function is a default likelihood function;
      second circuitry to calculate a syndrome vector based on the first bit reliability information;
      third circuitry to select, based on the syndrome vector, one of the first likelihood function or a second likelihood function, and to signal that an error correction is to be performed, based on the selected one of the first likelihood function or the second likelihood function, with one of the first bit reliability information or second bit reliability information; and fourth circuitry to perform the error correction based on the second likelihood function, comprising circuitry to calculate the second bit reliability information based on the data signals and the second likelihood function, wherein the second bit reliability information is to comprise second values which each correspond to a different respective one of the first values, wherein an average magnitude of the first values is less than an average magnitude of the second values; and a display device coupled to the integrated circuit, the display device to display an image based on the codeword.

10. The system of claim 9, wherein the third circuitry comprises circuitry to multiplex between a first signal which indicates the first likelihood function, and a second signal which indicates the second likelihood function.

11. The system of claim 9, wherein:

the first values are each in a range of possible values which each indicate a respective confidence that a given data signal indicates one of a first logic state or a second logic state, the possible values comprising more than two values; and the second values are each in the range of possible values.

12. The system of claim 9, wherein the second circuitry to calculate the syndrome vector comprises circuitry to provide the first bit reliability information to interconnected nodes, the device further comprising fourth circuitry to perform the error correction with the interconnected nodes.

13. One or more non-transitory computer-readable storage media having stored thereon instructions which, when executed by one or more processing units, cause the one or more processing units to perform a method comprising:

calculating first bit reliability information based on data signals and a first likelihood function, wherein the data signals each indicate a respective bit of a codeword, wherein the first bit reliability information comprises first values which each correspond to a different respective bit of the codeword, wherein the first likelihood function is a default likelihood function;

calculating a syndrome vector based on the first bit reliability information;

based on the syndrome vector, selecting one of the first likelihood function or a second likelihood function; and signaling that an error correction is to be performed, based on the selected one of the first likelihood function or the second likelihood function, with one of the first bit reliability information or second bit reliability information; and performing the error correction based on the second likelihood function, comprising calculating the second bit reliability information based on the data signals and the second likelihood function, wherein the second bit reliability information comprises second values which each correspond to a different respective one of the first values, wherein an average magnitude of the first values is less than an average magnitude of the second values.

14. The one or more computer-readable storage media of claim 13, wherein selecting the one of the first likelihood function or the second likelihood function comprises multiplexing between a first signal which indicates the first likelihood function, and a second signal which indicates the second likelihood function.

15. The one or more computer-readable storage media of claim 13, wherein:

the first values are each in a range of possible values which each indicate a respective confidence that a given data signal indicates one of a first logic state or a second logic state, the possible values comprising more than two values; and the second values are each in the range of possible values.

16. The one or more computer-readable storage media of claim 13, wherein selecting one of the first likelihood function or the second likelihood function comprises determining whether to apply a scalar multiplier to the first likelihood function.

17. The one or more computer-readable storage media of claim 13, wherein selecting one of the first likelihood function or the second likelihood function is based on a bit error rate indicated by the syndrome vector.

\* \* \* \* \*